United States Patent
Yi

(10) Patent No.: US 10,193,537 B2
(45) Date of Patent: Jan. 29, 2019

(54) RANDOM DATA GENERATION CIRCUIT, MEMORY STORAGE DEVICE AND RANDOM DATA GENERATION METHOD

(71) Applicant: PHISON ELECTRONICS CORP., Miaoli (TW)

(72) Inventor: Bing-Wei Yi, Taichung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 6 days.

(21) Appl. No.: 15/487,417

(22) Filed: Apr. 13, 2017

(65) Prior Publication Data
US 2018/0241381 A1    Aug. 23, 2018

(30) Foreign Application Priority Data
Feb. 21, 2017   (TW) .............................. 106105738 A

(51) Int. Cl.
| | | |
|---|---|---|
| *H03K 3/012* | (2006.01) | |
| *H03K 3/84* | (2006.01) | |
| *H03K 5/159* | (2006.01) | |
| *H03K 5/19* | (2006.01) | |
| *G11C 7/24* | (2006.01) | |
| *G06F 7/58* | (2006.01) | |
| *G11C 7/22* | (2006.01) | |
| *H03K 19/21* | (2006.01) | |
| *G11C 27/02* | (2006.01) | |

(52) U.S. Cl.
CPC .............. *H03K 3/84* (2013.01); *G06F 7/588* (2013.01); *G11C 7/24* (2013.01); *H03K 5/159* (2013.01); *H03K 5/19* (2013.01); *G11C 7/22* (2013.01); *G11C 27/02* (2013.01); *H03K 19/21* (2013.01)

(58) Field of Classification Search
None
See application file for complete search history.

(56) References Cited

U.S. PATENT DOCUMENTS

| | | | | |
|---|---|---|---|---|
| 4,214,209 | A  * | 7/1980 | Baier ...................... | H04L 7/043 375/367 |
| 6,246,738 | B1 * | 6/2001 | Acimovic ............ | H03D 13/001 327/147 |
| 2008/0130810 | A1 * | 6/2008 | Bae ........................ | H04L 7/0337 375/355 |
| 2011/0169580 | A1 * | 7/2011 | Dodrill .................. | H03B 29/00 331/56 |
| 2012/0256782 | A1 * | 10/2012 | Matsumoto ........... | G01F 23/284 342/124 |

(Continued)

FOREIGN PATENT DOCUMENTS

| | | |
|---|---|---|
| TW | 200805143 | 1/2008 |
| TW | 201405359 | 2/2014 |

*Primary Examiner* — Cassandra Cox
(74) *Attorney, Agent, or Firm* — JCIPRNET

(57) ABSTRACT

An exemplary embodiment of the disclosure provides a random data generation circuit which includes a phase difference detection circuit and a random data output circuit. The phase difference detection circuit detects a phase difference between a first clock signal and a second clock signal and outputs phase difference information. The random data output circuit is coupled to the phase difference detection circuit and outputs random data according to the phase difference information. Thereby, ideal and unpredictable random data is generated.

27 Claims, 9 Drawing Sheets

(56) References Cited

U.S. PATENT DOCUMENTS

2015/0154006 A1* 6/2015 Yang ................... G06F 7/588
                                                708/251
2015/0193204 A1* 7/2015 Lin ..................... G06F 7/588
                                                708/250

* cited by examiner

RANDOM DATA GENERATION CIRCUIT, MEMORY STORAGE DEVICE AND RANDOM DATA GENERATION METHOD

CROSS-REFERENCE TO RELATED APPLICATION

This application claims the priority benefit of Taiwan application serial no. 106105738, filed on Feb. 21, 2017. The entirety of the above-mentioned patent application is hereby incorporated by reference herein and made a part of this specification.

BACKGROUND

Technology Field

The disclosure relates to a random data generation circuit and more particularly relates to a random data generation circuit, a memory storage device, and a random data generation method.

Description of Related Art

The market of digital cameras, mobile phones, and MP3 players has expanded rapidly in recent years, resulting in consumers' escalating demand for storage media. The characteristics of data non-volatility, low power consumption, compact size, and no mechanical structure make rewritable non-volatile memory modules (e.g., flash memory) ideal for being built in the portable multi-media devices as cited above.

For concern about data security, memory storage devices generally use random data to encrypt the stored data. One conventional method is to generate random data based on the clock jitter of a data clock signal. In general, the data clock signal may have a clock jitter at a clock edge due to influence of circuit noise. For this reason, when data clock signal is sampled, uncertain outputs may occur due to the clock jitter. Therefore, the memory storage device may use the uncertain outputs to generate random data and use the generated random data to encrypt the stored data. However, as the proportion of the clock jitter to the entire data clock signal is very small, certain outputs may easily occur during sampling, resulting in generation of undesirable random data.

Moreover, if the circuit that generates two voltages in the circuit system is kept in a circuit metastable state first and releases the two voltages simultaneously at a specific time point, the two voltages will have different voltage changes at each release due to influence of noise. Hence, random data may also be generated by the uncertainty of the voltage changes. Such a method, however, still has the adverse effect of being easily predictable.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a random data generation circuit, a memory storage device, and a random data generation method for generating random data that is ideal and difficult to predict.

In an exemplary embodiment of the disclosure, a random data generation circuit is provided, which includes a phase difference detection circuit and a random data output circuit. The phase difference detection circuit is configured to detect phase difference between a first clock signal and a second clock signal and output phase difference information. The random data output circuit is coupled to the phase difference detection circuit and configured to output random data according to the phase difference information.

In another exemplary embodiment of the disclosure, a memory storage device is provided, which includes a connection interface unit, a rewritable non-volatile memory module, and a memory control circuit unit. The connection interface unit is coupled to a host system and includes a random data generation circuit. The memory control circuit unit is coupled to the connection interface unit and the rewritable non-volatile memory module. The random data generation circuit includes a phase difference detection circuit and a random data output circuit. The phase difference detection circuit is configured to detect a phase difference between a first clock signal and a second clock signal and output phase difference information. The random data output circuit is coupled to the phase difference detection circuit and configured to output random data according to the phase difference information.

In another exemplary embodiment of the disclosure, a random data generation method is provided for a memory storage device. The random data generation method includes detecting a phase difference between a first clock signal and a second clock signal and outputting phase difference information; and outputting random data according to the phase difference information.

Based on the above, the random data generation circuit is configured to detect the phase difference between multiple clock signals and output random data according to the detection result. Thus, the circuit configuration of the disclosure is capable of generating ideal and unpredictable random data.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
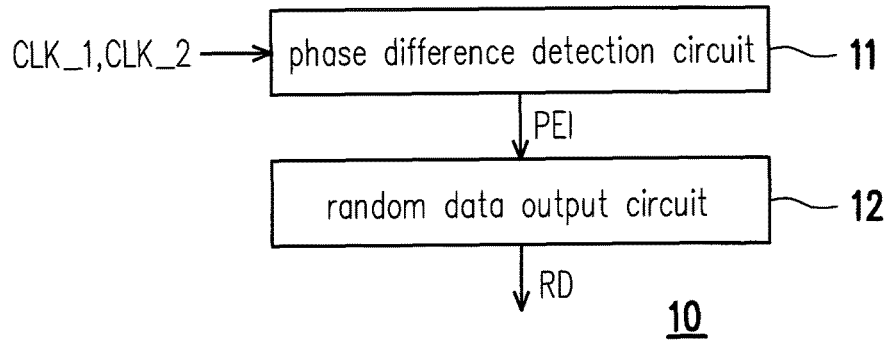
FIG. 1 is a schematic diagram showing a random data generation circuit according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts. However, it should be noted that the disclosure is not limited to the disclosed exemplary embodiments. Moreover, some exemplary embodiments may be combined where appropriate.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

The term "couple" used throughout this specification (including the claims) may refer to any direct or indirect connection means. For example, if it is described that the first device is coupled to the second device, it should be understood that the first device may be directly connected to the second device or indirectly connected to the second device through other devices or certain connection means. In addition, the term "signal" may refer to at least one current, voltage, charge, temperature, data, or one or more signals.

FIG. 1 is a schematic diagram showing a random data generation circuit according to an exemplary embodiment of the disclosure.

Referring to FIG. 1, a random data generation circuit 10 includes a phase difference detection circuit 11 and a random data output circuit 12.

The phase difference detection circuit 11 is configured to detect a phase difference between a clock signal CLK_1 (also referred to as a first clock signal) and a clock signal CLK_2 (also referred to as a second clock signal) and output phase difference information PEI. For example, the phase difference information PEI is generated corresponding to the phase difference between the clock signal CLK_1 and the clock signal CLK_2. In an exemplary embodiment, the clock signal CLK_1 and the clock signal CLK_2 are generated by the same oscillator. In another exemplary embodiment, the clock signal CLK_1 and the clock signal CLK_2 are generated by different oscillators. In an exemplary embodiment, the oscillator is disposed in the random data generation circuit 10. In another exemplary embodiment, the oscillator is disposed outside the random data generation circuit 10. In an exemplary embodiment, a frequency of the clock signal CLK_1 is the same as a frequency of the clock signal CLK_2. For example, the clock signal CLK_1 and the clock signal CLK_2 may be generated based on the same base frequency. In another exemplary embodiment, the frequency of the clock signal CLK_1 is different from the frequency of the clock signal CLK_2. For example, the clock signal CLK_1 may be generated based on a base frequency (also referred to as a first base frequency) while the clock signal CLK_2 may be generated based on another base frequency (also referred to as a second base frequency), and the first base frequency is different from the second base frequency.

The random data output circuit 12 is coupled to the phase difference detection circuit 11 and is configured to output random data RD according to the phase difference information PEI. Specifically, in a process of outputting the clock signal CLK_1 and the clock signal CLK_2, at least one of the clock signal CLK_1 and the clock signal CLK_2 may have a clock jitter due to influence of noise. The clock jitter causes a phase of the clock signal CLK_1 and/or a phase of the clock signal CLK_2 to change randomly. As the phase of the clock signal CLK_1 and/or the phase of the clock signal CLK_2 changes randomly, the phase difference between the clock signal CLK_1 and the clock signal CLK_2 changes randomly as well. Therefore, after the phase difference detection circuit 11 outputs the corresponding phase difference information PEI according to the detected phase difference, the random data RD that the random data output circuit 12 outputs according to the phase difference information PEI is also random (or unpredictable).

Figure 2:
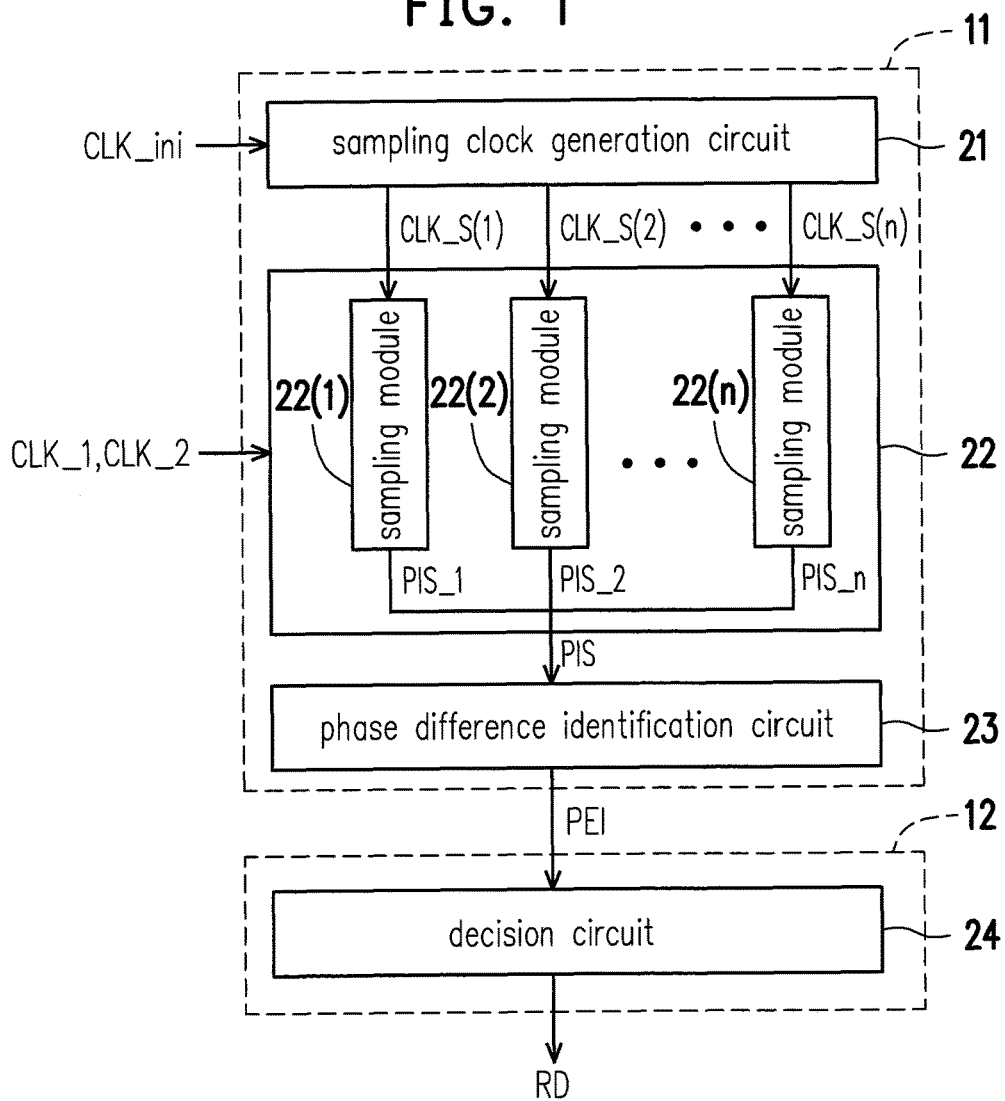
FIG. 2 is a schematic diagram showing a random data generation circuit according to another exemplary embodiment of the disclosure.

FIG. 2 is a schematic diagram showing the random data generation circuit according to another exemplary embodiment of the disclosure.

Referring to FIG. 2, the phase difference detection circuit 11 includes a sampling clock generation circuit 21, a sampling circuit 22, and a phase difference identification circuit 23.

The sampling clock generation circuit 21 is configured to generate a plurality of sampling clock signals CLK_S(1) to CLK_S(n) according to an initial signal CLK_ini. In this exemplary embodiment, a predetermined phase difference exists between sampling clock signals CLK_S(j) to CLK_S(j+1), wherein $0 \leq j < n$ and j is a positive integer. For example, the same predetermined phase difference may exist between the sampling clock signals CLK_S(1) and CLK_S(2), between the sampling clock signals CLK_S(2) and CLK_S(3), and between the sampling clock signals CLK_S(n−1) and CLK_S(n). In addition, in another exemplary embodiment, the predetermined phase difference between the sampling clock signals CLK_S(k−1) to CLK_S(k) may be different from the predetermined phase difference between the sampling clock signals CLK_S(k) to CLK_S(k+1), wherein 1<k<n and k is a positive integer. For example, the phase difference between the sampling clock signals CLK_S(1) and CLK_S(2) may be different from the phase difference between the sampling clock signals CLK_S(2) and CLK_S(3), and/or the phase difference between the sampling clock signals CLK_S(n−2) and CLK_S(n−1) may be different from the phase difference between the sampling clock signals CLK_S(n−1) and CLK_S(n).

The sampling circuit 22 is coupled to the sampling clock generation circuit 21 and is configured to receive the clock signal CLK_1, the clock signal CLK_2, and the sampling clock signals CLK_S(1) to CLK_S(n). The sampling circuit 22 is configured to sample the clock signal CLK_1 and the clock signal CLK_2 based on the sampling clock signals CLK_S(1) to CLK_S(n) and generate a phase identification signal PIS.

In this exemplary embodiment, the sampling circuit 22 includes a plurality of sampling modules 22(1) to 22(n). Each of the sampling modules 22(1) to 22(n) is configured to sample the clock signal CLK_1 and the clock signal CLK_2 based on one specific sampling clock signal of the sampling clock signals CLK_S(1) to CLK_S(n) and output a corresponding sampling result. For example, the sampling module 22(1) receives the clock signal CLK_1, the clock signal CLK_2, and the sampling clock signal CLK_S(1), and samples the clock signal CLK_1 and the clock signal CLK_2 based on the sampling clock signal CLK_S(1); the sampling module 22(2) receives the clock signal CLK_1, the clock signal CLK_2, and the sampling clock signal CLK_S(2), and samples the clock signal CLK_1 and the clock signal CLK_2 based on the sampling clock signal CLK_S(2); and the sampling module 22(n) receives the clock signal CLK_1, the clock signal CLK_2, and the sampling clock signal CLK_S(n), and samples the clock signal CLK_1 and the clock signal CLK_2 based on the sampling clock signal CLK_S(n). Then, the sampling circuit 22 generates the phase identification signal PIS according to the sampling results of the sampling modules 22(1) to 22(n). In an exemplary embodiment, one sampling module of the sampling modules 22(1) to 22(n) is called a first sampling module while another sampling module of the sampling modules 22(1) to 22(n) is called a second sampling module.

Figure 3:
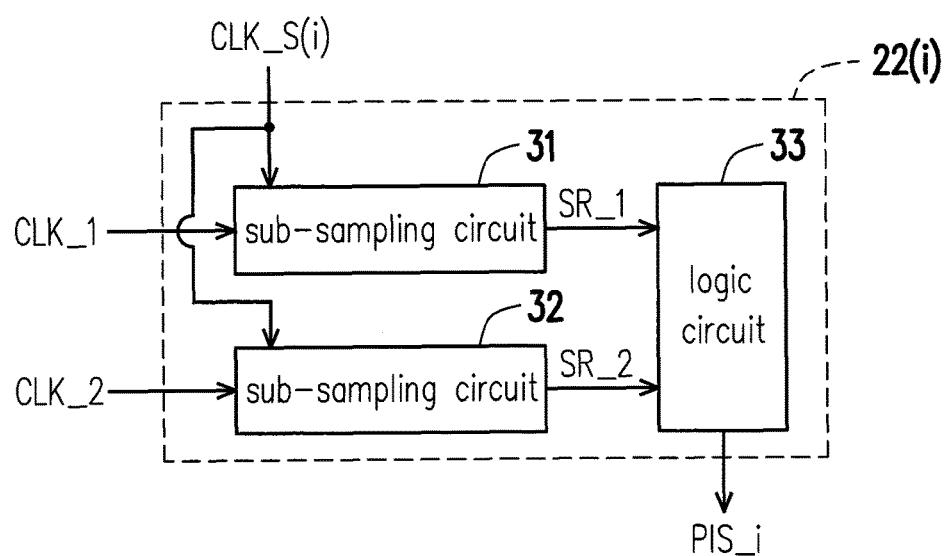
FIG. 3 is a schematic diagram showing a sampling module according to an exemplary embodiment of the disclosure.

FIG. 3 is a schematic diagram showing the sampling module according to an exemplary embodiment of the disclosure. It should be noted that the exemplary embodiment of FIG. 3 illustrates a sampling module 22(i) as an example (0<i<n+1 and i is a positive integer), and the sampling module 22(i) may be any one of the sampling modules 22(1) to 22(n).

Referring to FIG. 3, the sampling module 22(i) includes a sub-sampling circuit 31 (also referred to as a first sub-sampling circuit), a sub-sampling circuit 32 (also referred to as a second sub-sampling circuit), and a logic circuit 33. The sampling module 22(i) is configured to receive the clock signal CLK_1, the clock signal CLK_2, and a sampling clock signal CLK_S(i), and sample the clock signal CLK_1 and the clock signal CLK_2 based on the sampling clock signal CLK_S(i).

Specifically, the sub-sampling circuit 31 samples the clock signal CLK_1 based on the sampling clock signal CLK_S(i) while the sub-sampling circuit 32 samples the clock signal CLK_2 based on the sampling clock signal CLK_S(i). For example, after receiving the sampling clock signal CLK_S(i), the sub-sampling circuit 31 and the sub-sampling circuit 32 samples the clock signal CLK_1 and the clock signal CLK_2 respectively based on the same clock edge (also referred to as a first clock edge) of the sampling clock signal CLK_S(i). Then, the sub-sampling circuit 31 outputs a sampling result SR_1 (also referred to as a first sampling result) and the sub-sampling circuit 32 outputs a sampling result SR_2 (also referred to as a second sampling result).

The logic circuit 33 is coupled to the sub-sampling circuit 31 and the sub-sampling circuit 32 and is configured to generate a phase identification sub-signal PIS_i according to the sampling result SR_1 and the sampling result SR_2. Specifically, the logic circuit 33 executes a logical operation on the sampling result SR_1 and the sampling result SR_2 to generate the phase identification sub-signal PIS_i. For example, the logic circuit 33 may execute a logical operation, such as XOR (exclusive or), on the sampling result SR_1 and the sampling result SR_2 that have been received and output a logical value as the phase identification sub-signal PIS_i. Take an XOR operation as an example, if the sampling result SR_1 and the sampling result SR_2 correspond to different logical states (for example, the sampling result SR_1 is logic "1" while the sampling result SR_2 is logic "0", or the sampling result SR_1 is logic "0" while the sampling result SR_2 is logic "1"), the logic circuit 33 outputs the phase identification sub-signal PIS_i corresponding to the logical value "1"; on the other hand, if the sampling result SR_1 and the sampling result SR_2 are the same logical state (for example, the sampling result SR_1 and the sampling result SR_2 are both logic "0", or the sampling result SR_1 and the sampling result SR_2 are both logic "1"), the logic circuit 33 outputs the phase identification sub-signal PIS_i corresponding to the logical value "0". Nevertheless, the disclosure is not limited to the above. In other exemplary embodiments of the disclosure, the logic circuit 33 may execute other types of logical operations on the sampling result SR_1 and the sampling result SR_2.

Figure 4:
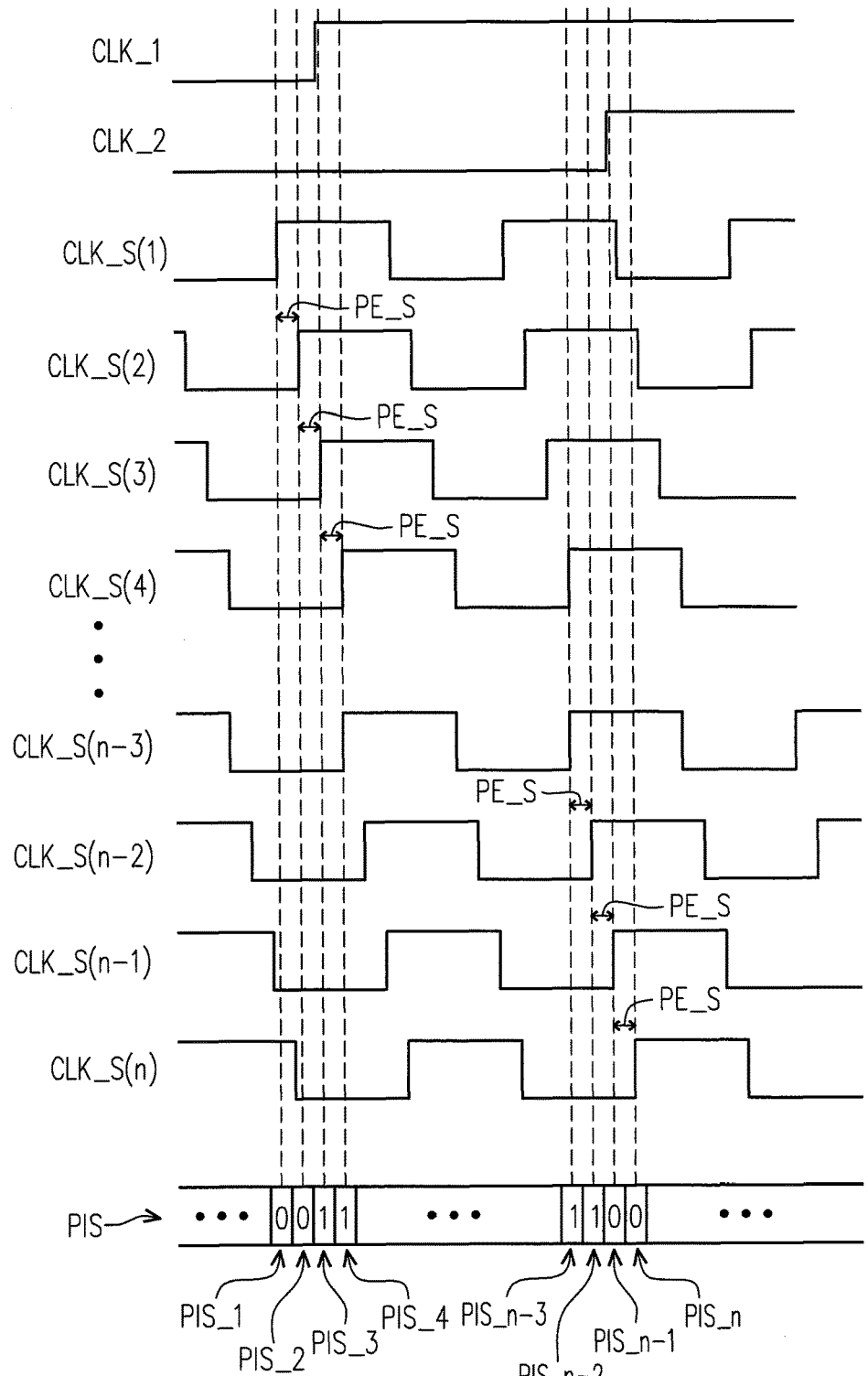
FIG. 4 is a schematic diagram showing generation of a phase identification signal according to an exemplary embodiment of the disclosure.

FIG. 4 is a schematic diagram showing generation of the phase identification signal according to an exemplary embodiment of the disclosure.

Referring to FIG. 4, in this exemplary embodiment, the sampling clock generation circuit 21 generates a plurality of sampling clock signals CLK_S(1) to CLK_S(n). For example, a predetermined phase difference PE_S exists between the sampling clock signals CLK_S(1) and CLK_S(2), between the sampling clock signals CLK_S(2) and CLK_S(3), and between the sampling clock signals CLK_S(n−1) and CLK_S(n). After sampling the clock signal CLK_1 and the clock signal CLK_2 based on the sampling clock signals CLK_S(1) to CLK_S(n) and executing the corresponding logical operation, the phase identification signal PIS is generated.

In this exemplary embodiment, when the clock signal CLK_1 and the clock signal CLK_2 are sampled based on the sampling clock signal CLK_S(1), the sampling result of the clock signal CLK_1 and the sampling result of the clock signal CLK_2 correspond to the same logical state (both are logic "0"), and a phase identification sub-signal PIS_1 corresponds to the logical value "0". Likewise, when the clock signal CLK_1 and the clock signal CLK_2 are sampled based on the sampling clock signal CLK_S(2), a phase identification sub-signal PIS_2 that is generated corresponds to the logical value "0"; when the clock signal CLK_1 and the clock signal CLK_2 are sampled based on the sampling clock signal CLK_S(n−1), a phase identification sub-signal PIS_n−1 that is generated corresponds to the logical value "0"; and when the clock signal CLK_1 and the clock signal CLK_2 are sampled based on the sampling clock signal CLK_S(n), a phase identification sub-signal PIS_n that is generated corresponds to the logical value "0" as well.

In this exemplary embodiment, when the clock signal CLK_1 and the clock signal CLK_2 are sampled based on the sampling clock signal CLK_S(3), the sampling result of the clock signal CLK_1 and the sampling result of the clock signal CLK_2 correspond to different logical states (the sampling result of the clock signal CLK_1 corresponds to logic "1" while the sampling result of the clock signal CLK_2 corresponds to logic "0"), and a phase identification sub-signal PIS_3 that is generated corresponds to the logical value "1". Likewise, when the clock signal CLK_1 and the clock signal CLK_2 are sampled based on the sampling clock signals CLK_S(4) to CLK_S(n-2), the phase identification sub-signals PIS_4 to PIS_(n-2) that are generated all correspond to the logical value "1".

Further, referring to FIG. 2 again, the phase difference identification circuit 23 is coupled to the sampling circuit 22 to receive the phase identification signal PIS, which includes the phase identification sub-signals PIS_1 to PIS_n. The phase difference identification circuit 23 is configured to generate the phase difference information PEI according to the phase identification signal PIS. In an exemplary embodiment, the phase difference information PEI reflects the total number of the phase identification sub-signals corresponding to a certain logical value (also referred to as a first logical value) in the phase identification signal PIS. For example, in the exemplary embodiment of FIG. 4, the first logical value is logic "1".

The random data output circuit 12 includes a decision circuit 24. The decision circuit 24 is coupled to the phase difference identification circuit 23 and is configured to determine one or more bit values in the random data RD according to the phase difference information PEI. In this exemplary embodiment, the decision circuit 24 determines whether the phase difference information PEI meets a first condition or a second condition. If the phase difference information PEI meets the first condition, the decision circuit 24 outputs a predetermined bit value (also referred to as a first bit value). If the phase difference information PEI meets the second condition (or the phase difference information PEI does not meet the first condition), the decision circuit 24 outputs another predetermined bit value (also referred to as a second bit value). The first bit value is different from the second bit value.

In this exemplary embodiment, the first condition is an odd condition and the second condition is an even condition. For example, the decision circuit 24 determines whether the total number of the phase identification sub-signals (e.g., the phase identification sub-signals PIS_3 to PIS_n-2 in FIG. 4) corresponding to the first logical value in the phase identification signal PIS is odd or even according to the phase difference information PEI. If the total number of the phase identification sub-signals PIS_3 to PIS_n-2 is odd, the decision circuit 24 determines that the phase difference information PEI meets the first condition. On the other hand, if the total number of the phase identification sub-signals PIS_3 to PIS_n-2 is even, the decision circuit 24 determines that the phase difference information PEI meets the second condition (or the phase difference information PEI does not meet the first condition). It should be noted that, in another exemplary embodiment, the first condition and the second condition may also be other conditions as long as different bit values are generated according to different phase difference information PEI.

In this exemplary embodiment, the first bit value is "1" and the second bit value is "0". In another exemplary embodiment, the first bit value is "0" and the second bit value is "1". Moreover, in other exemplary embodiments, the first bit value may be a combination of a plurality of bit values (e.g., "11", "01", or "101") and the second bit value may be a combination of a plurality of bit values (e.g., "00", "10", or "010"). In addition, more conditions (e.g., a third condition and/or a fourth condition) may be set. Accordingly, the corresponding bit value is outputted according to whether the phase difference information PEI meets any one of the conditions.

Figure 5:
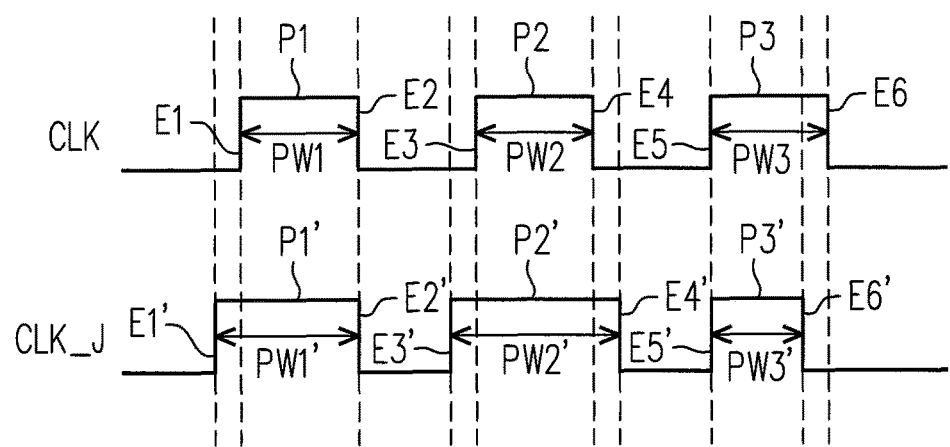
FIG. 5 is a schematic diagram showing a clock signal having a clock jitter according to an exemplary embodiment of the disclosure.

FIG. 5 is a schematic diagram showing a clock signal having a clock jitter according to an exemplary embodiment of the disclosure.

Referring to FIG. 5, a clock signal CLK represents an ideal clock signal that has not been influenced by noise. For example, all pulses (e.g., pulses P1 to P3) of the clock signal CLK have the same pulse width (e.g., pulse widths PW1 to PW3 are the same). When influenced by noise, at least one clock edge of the clock signal CLK may be shifted. For example, the phases of clock edges E1, E3, E4, and E6 of the clock signal CLK may be shifted forward, forward, backward, and forward respectively. For example, a clock signal CLK_J represents a clock signal CLK that has been influenced by noise. Clock edges E1', E3', E4', and E6' of the clock signal CLK_J represent the clock edges E1, E3, E4, and E6 that have been shifted. The pulse widths of part of the pulses of the clock signal CLK may be changed corresponding to the shift. For example, a pulse width PW1' of a pulse P1' is wider than the pulse width PW1 of the pulse P1; a pulse width PW2' of a pulse P2' is wider than the pulse width PW2 of the pulse P2; and a pulse width PW3' of a pulse P3' is narrower than the pulse width PW3 of the pulse P3.

It should be noted that, in the exemplary embodiment of FIG. 5, the shift is random and unpredictable. In an exemplary embodiment, the shift of one or more clock edges as described above may also be called a clock jitter. In another exemplary embodiment, the clock jitter also includes influence on a pulse amplitude and/or a clock frequency, not limited to phase shift. In an exemplary embodiment, the clock jitter is evaluated in one or more jitter units, and an evaluation unit for evaluating the phase difference between the first clock signal and the second clock signal is consistent with the jitter unit of the clock jitter.

Figure 6:
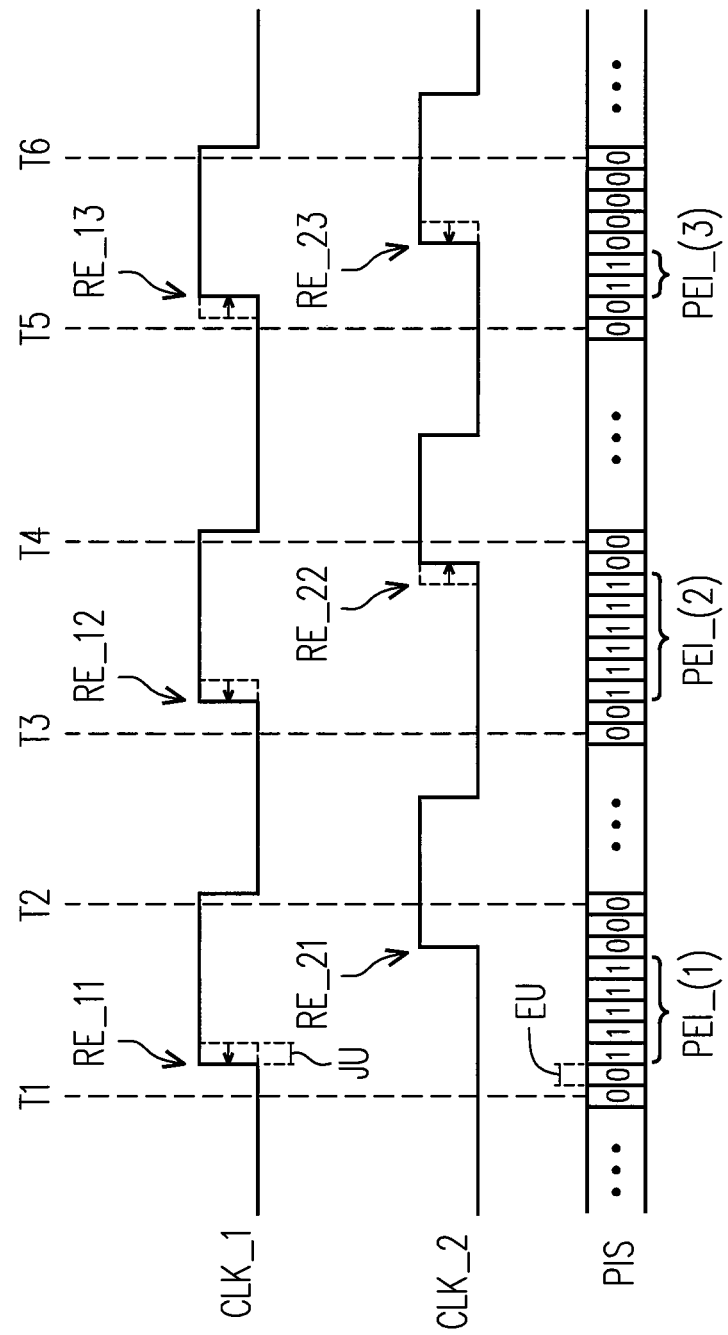
FIG. 6 is a schematic diagram showing a relationship between phase difference information and a clock jitter according to an exemplary embodiment of the disclosure.

FIG. 6 is a schematic diagram showing a relationship between the phase difference information and the clock jitter according to an exemplary embodiment of the disclosure.

Referring to FIG. 6, it is assumed that rising edges RE_11 and RE_12 of the clock signal CLK_1 both are shifted forward by one jitter unit JU while a rising edge RE_13 is shifted backward by one jitter unit JU due to the clock jitter. Moreover, a rising edge RE_22 of the clock signal CLK_2 is shifted backward by one jitter unit JU while a rising edge RE_23 shifts forward by one jitter unit JU due to the clock jitter. Based on these randomly shifts, the phase difference between the clock signal CLK_1 and the clock signal CLK_2 also changes randomly.

After the clock signal CLK_1 and the clock signal CLK_2 of FIG. 6 are sampled by the sampling clock signals CLK_S(1) to CLK_S(n) indicated in FIG. 2 or FIG. 4, phase difference information PEI_(1) to PEI_(3) is generated. The phase difference information PEI_(1) corresponds to the phase difference between the clock signal CLK_1 and the clock signal CLK_2 during a time period from a time point T1 to a time point T2; the phase difference information PEI_(2) corresponds to the phase difference between the clock signal CLK_1 and the clock signal CLK_2 during a time period from a time point T3 to a time point T4; and the phase difference information PEI_(3) corresponds to the phase difference between the clock signal CLK_1 and the clock signal CLK_2 during a time period from a time point T5 to a time point T6. For example, the phase difference information PEI_(1) reflects that five phase identification sub-signals in the phase identification signal PIS between the time point T1 and the time point T2 correspond to logic value "1"; the phase difference information PEI_(2) reflects that six phase identification sub-signals in the phase identification signal PIS between the time point T3 and the time point T4 correspond to logic value "1"; and the phase difference information PEI_(3) reflects that two phase identification sub-signals in the phase identification signal PIS between the time point T5 and the time point T6 correspond to logic value "1".

It should be noted that, in the exemplary embodiment of FIG. 6, each phase identification sub-signal in the phase identification signal PIS corresponds to one evaluation unit EU of the phase difference. Therefore, from the time point T1 to the time point T2, the phase difference between the clock signal CLK_1 and the clock signal CLK_2 may be regarded as 5EU (i.e., 5×EU); from the time point T3 to the time point T4, the phase difference between the clock signal CLK_1 and the clock signal CLK_2 may be regarded as 6EU (i.e., 6×EU); and from the time point T5 to the time point T6, the phase difference between the clock signal CLK_1 and the clock signal CLK_2 may be regarded as 2EU (i.e., 2×EU).

Corresponding to the different phase differences between the clock signal CLK_1 and the clock signal CLK_2, the random data RD may be outputted. For example, corresponding to 5EU (i.e., the phase difference between the clock signal CLK_1 and the clock signal CLK_2 from the time point T1 to the time point T2), the outputted random data RD is a bit "0"; corresponding to 6EU (i.e., the phase difference between the clock signal CLK_1 and the clock signal CLK_2 from the time point T3 to the time point T4), the outputted random data RD is a bit "1"; and corresponding to 2EU (i.e., the phase difference between the clock signal CLK_1 and the clock signal CLK_2 from the time point T5 to the time point T6), the outputted random data RD is a bit "1" as well. In other words, in an exemplary embodiment of FIG. 6, the bit "0", the bit "1", and the bit "1" may be continuously outputted as the random data RD.

It should be noted that, in an exemplary embodiment of FIG. 6, a time-based width of one evaluation unit EU of the phase difference is the same as or similar to a time-based width of one jitter unit JU of the clock jitter that occurs on the clock signal CLK_1 and/or the clock signal CLK_2. Therefore, when the clock signal CLK_1 and/or the clock signal CLK_2 has a clock jitter corresponding to P jitter units JU, the phase difference between the clock signal CLK_1 and the clock signal CLK_2 may change by Q evaluation units EU, wherein P and Q are both positive integers.

Figure 7:
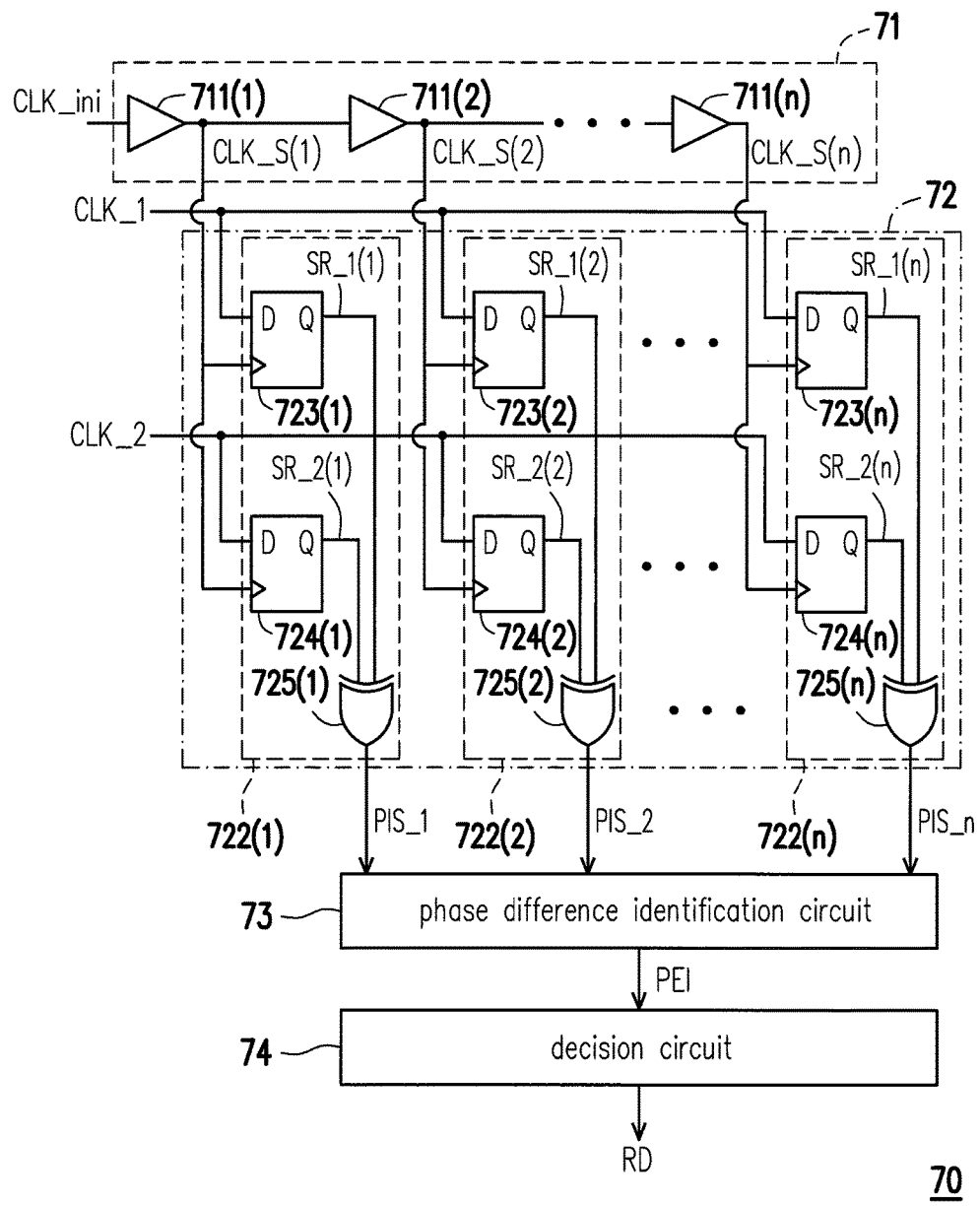
FIG. 7 is a schematic diagram showing a random data generation circuit according to another exemplary embodiment of the disclosure.

FIG. 7 is a schematic diagram showing a random data generation circuit according to another exemplary embodiment of the disclosure.

Referring to FIG. 7, a random data generation circuit 70 includes a sampling clock generation circuit 71, a sampling circuit 72, a phase difference identification circuit 73, and a decision circuit 74.

The sampling clock generation circuit 71 receives a clock signal CLK_ini (i.e., an initial signal) and delays the clock signal CLK_ini according to different delay stages to output a plurality of sampling clock signals CLK_S(1) to CLK_S(n). In this exemplary embodiment, the sampling clock generation circuit 71 includes a plurality of buffer units 711(1) to 711(n) that are connected in series, and each of the buffer units 711(1) to 711(n) is a forward buffer component. After the buffer unit 711(1) receives the clock signal CLK_ini, the buffer units 711(1) to 711(n) sequentially delay the clock signal CLK_ini and output the corresponding delay clock signals CLK_S(1) to CLK_S(n). The delay stage of the clock signal CLK_ini is increased by 1 every time it passes through one buffer unit. For example, the buffer unit 711(1) generates the sampling clock signal CLK_S(1), which corresponds to the delay stage "1"; the buffer unit 711(2) generates the sampling clock signal CLK_S(2), which corresponds to the delay stage "2"; and the buffer unit 711(n) generates the sampling clock signal CLK_S(n), which corresponds to the delay stage "n". The increase of the delay stage of a certain sampling clock signal indicates that the sampling clock signal has an increasing delay amount with respect to the clock signal CLK_ini. For example, FIG. 4 illustrates the phase change between the sampling clock signals CLK_S(1) to CLK_S(n) according to an exemplary embodiment of FIG. 7, and details thereof will not be repeated hereinafter.

The sampling circuit 72 is coupled to the sampling clock generation circuit 71. The sampling circuit 72 includes a plurality of sampling modules 722(1) to 722(n). Each of the sampling modules 722(1) to 722(n) includes two sampling circuits (also referred to as sub-sampling circuits) and a logic circuit. For example, the sampling module 722(1) includes a sampling circuit 723(1), a sampling circuit 724(1), and a logic circuit 725(1); the sampling module 722(2) includes a sampling circuit 723(2), a sampling circuit 724(2), and a logic circuit 725(2); and the sampling module 722(n) includes a sampling circuit 723(n), a sampling circuit 724(n), and a logic circuit 725(n). In this exemplary embodiment, each of the sampling circuits 723(1) to 723(n) and the sampling circuits 724(1) to 724(n) is a D-type flip-flop, and each of the logic circuits 725(1) to 725(n) is a XOR circuit.

The sampling circuit 723(1) and the sampling circuit 724(1) respectively sample the clock signal CLK_1 and the clock signal CLK_2 by using the sampling clock signal CLK_S(1) and respectively output a sampling result SR_1(1) and a sampling result SR_2(1); the sampling circuit 723(2) and the sampling circuit 724(2) respectively sample the clock signal CLK_1 and the clock signal CLK_2 by using the sampling clock signal CLK_S(2) and respectively output a sampling result SR_1(2) and a sampling result SR_2(2); and the sampling circuit 723(n) and the sampling circuit 724(n) respectively sample the clock signal CLK_1 and the clock signal CLK_2 by using the sampling clock signal CLK_S(n) and respectively output a sampling result SR_1(n) and a sampling result SR_2(n). The logic circuit 725(1) outputs a phase identification sub-signal PIS_1 according to the sampling result SR_1(1) and the sampling result SR_2(1); the logic circuit 725(2) outputs a phase identification sub-signal PIS_2 according to the sampling result SR_1(2) and the sampling result SR_2(2); and the logic circuit 725(n) outputs a phase identification sub-signal PIS_n according to the sampling result SR_1(n) and the sampling result SR_2(n). Other details of the operations of the sampling modules 722(1) to 722(n) have been specified in the exemplary embodiments of FIG. 3 and FIG. 4 and thus are not repeated hereinafter.

The phase difference identification circuit 73 is coupled to the sampling circuit 72 and is configured to output phase difference information PEI according to the phase identification sub-signals PIS_1 to PIS_n (i.e., the phase identification signal PIS). In an exemplary embodiment, the phase difference identification circuit 73 is an adder circuit, which is configured to obtain the total number of the phase identification sub-signals corresponding to the first logical value in the phase identification signal PIS (e.g., the phase difference information PEI_(1) to PEI_(3) in the exemplary embodiment of FIG. 6). The decision circuit 74 is coupled to the phase difference identification circuit 73 and is configured to output the corresponding random data RD according to the phase difference information PEI. For example, the decision circuit 74 may sequentially output the corresponding random data RD corresponding to the phase difference information PEI_(1) to PEI_(3) of FIG. 6. It should be noted that the phase difference identification circuit 73 and the decision circuit 74 are the same as or similar to the phase difference identification circuit 23 and the decision circuit 24 of FIG. 1 respectively, and details of the relevant operation have been specified above and thus are not repeated hereinafter.

Figure 8:
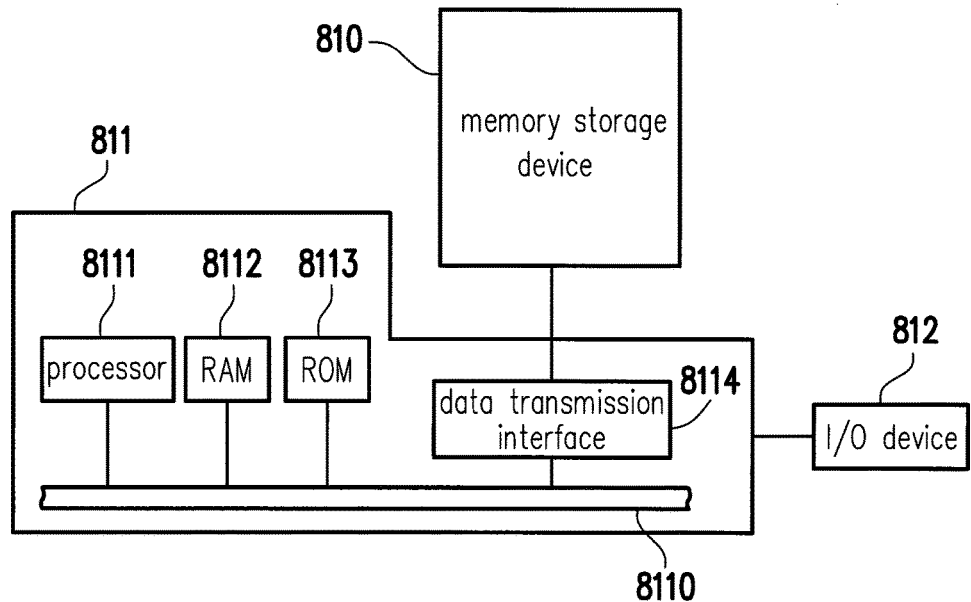
FIG. 8 is a schematic diagram showing a host system, a memory storage device, and an input/output (I/O) device according to an exemplary embodiment of the disclosure.
Figure 9:
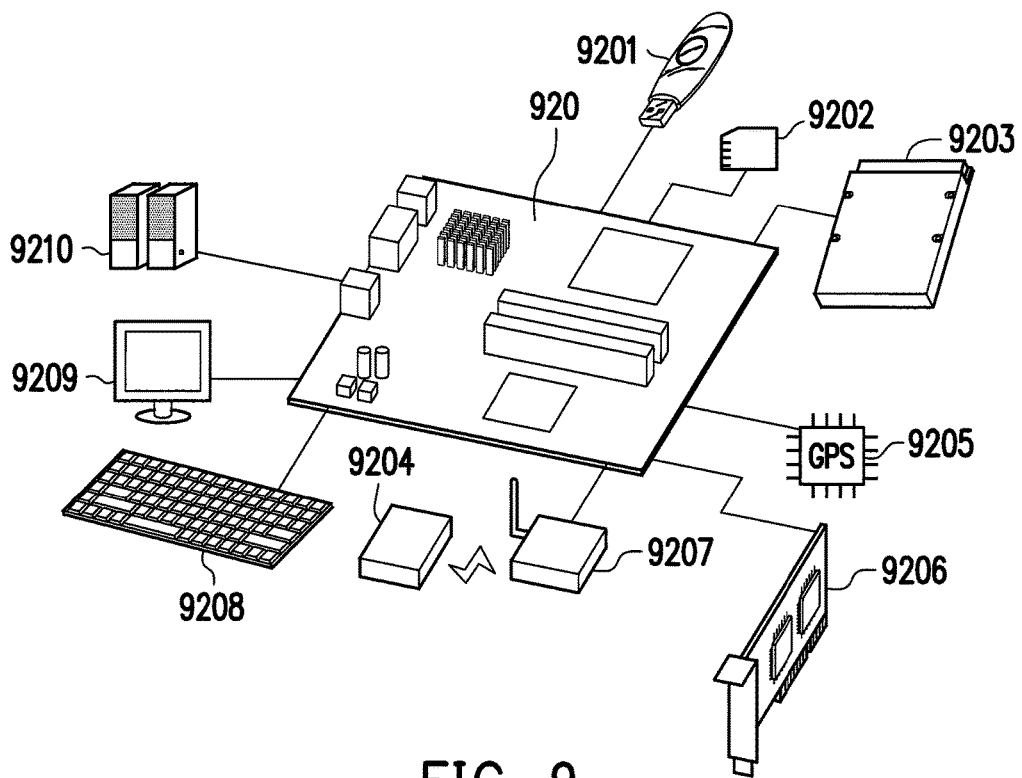
FIG. 9 is a schematic diagram showing a host system, a memory storage device, and an I/O device according to another exemplary embodiment of the disclosure.

FIG. 8 is a schematic diagram showing a host system, a memory storage device, and an input/output (I/O) device according to an exemplary embodiment of the disclosure. FIG. 9 is a schematic diagram showing the host system, the memory storage device, and the I/O device according to another exemplary embodiment of the disclosure.

Referring to FIG. 8 and FIG. 9, a host system 811 generally includes a processor 8111, a random access memory (RAM) 8112, a read only memory (ROM) 8113, and a data transmission interface 8114. The processor 8111, the random access memory 8112, the read only memory 8113, and the data transmission interface 8114 are all coupled to a system bus 8110.

In this exemplary embodiment, the host system 811 is coupled to a memory storage device 810 through the data transmission interface 8114. For example, the host system 811 may store data into or read data from the memory storage device 810 through the data transmission interface 8114. In addition, the host system 811 is coupled to an I/O device 12 through the system bus 8110. For example, the host system 811 may transmit an output signal to or receive an input signal from the I/O device 812 through the system bus 8110.

In this exemplary embodiment, the processor 8111, the random access memory 8112, the read only memory 8113, and the data transmission interface 8114 may be disposed on a motherboard 920 of the host system 811. One or more data transmission interfaces 8114 may be provided. Through the data transmission interface 8114, the motherboard 920 may be coupled to the memory storage device 810 in a wired or wireless manner. The memory storage device 810 may be a flash drive 9201, a memory card 9202, a solid state drive (SSD) 9203, or a wireless memory storage device 9204, for example. The wireless memory storage device 9204 may be a memory storage device based on a variety of wireless communication technologies, such as a near field communication (NFC) memory storage device, a wireless fidelity (WiFi) memory storage device, a Bluetooth memory storage device or a Bluetooth low energy memory storage device (e.g. iBeacon), and so on. In addition, the motherboard 920 may be coupled to an I/O device of any kind, such as a global positioning system (GPS) module 9205, a network interface card 9206, a wireless transmission device 9207, a keyboard 9208, a monitor 9209, a speaker 9210, etc., through the system bus 8110. For example, in an exemplary embodiment, the motherboard 920 may access the wireless memory storage device 9204 through the wireless transmission device 9207.

Figure 10:
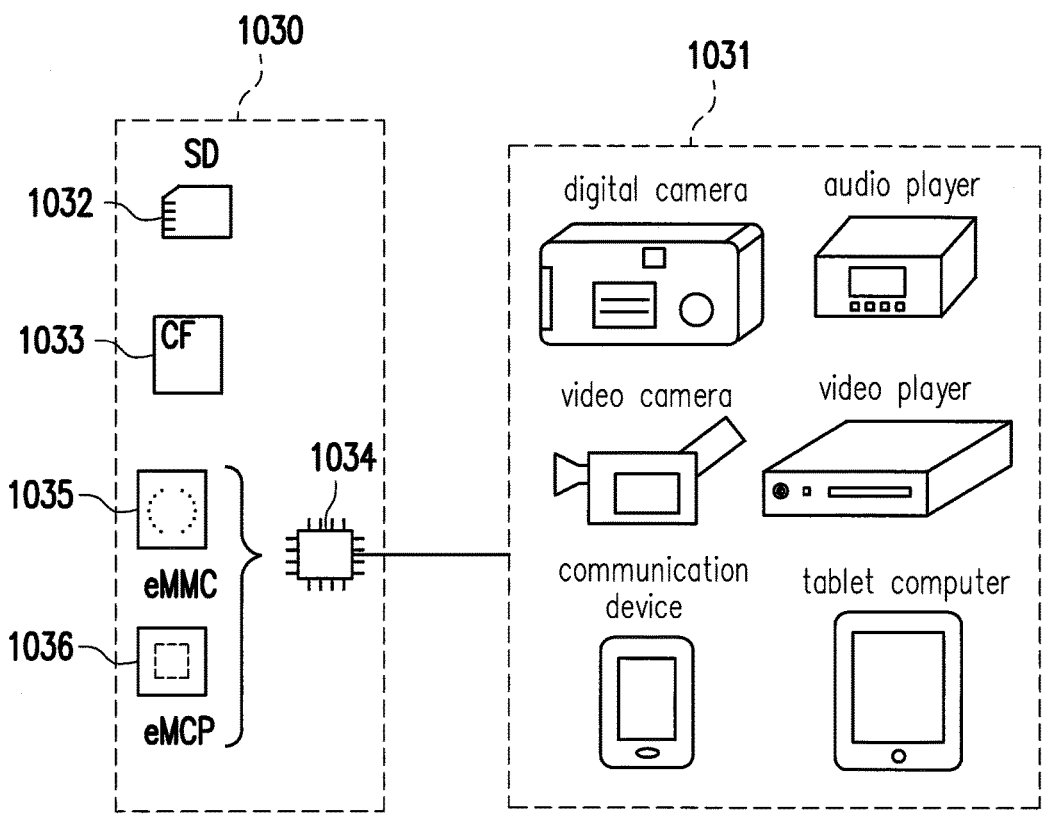
FIG. 10 is a schematic diagram showing a host system and a memory storage device according to another exemplary embodiment of the disclosure.

In an exemplary embodiment, the aforementioned host system may be any system substantially capable of collaborating with the memory storage device to store data. Even though the host system is described as a computer system in the exemplary embodiment above, FIG. 10 is a schematic diagram showing a host system and a memory storage device according to another exemplary embodiment of the disclosure. Referring to FIG. 10, in another exemplary embodiment, a host system 1031 may also be a system such as a digital camera, a video camera, a communication device, an audio player, a video player, a tablet computer, etc., and a memory storage device 1030 may be a non-volatile memory storage device of any kind, such as a secure digital (SD) card 1032, a compact flash (CF) card 1033, an embedded storage device 1034, etc. The embedded storage device 1034 includes an embedded storage device of any kind, where a memory module of any kind is directly coupled to a substrate of the host system, such as an embedded multimedia card (eMMC) 1035 and/or an embedded multi-chip package (eMCP) storage device 1036.

Figure 11:
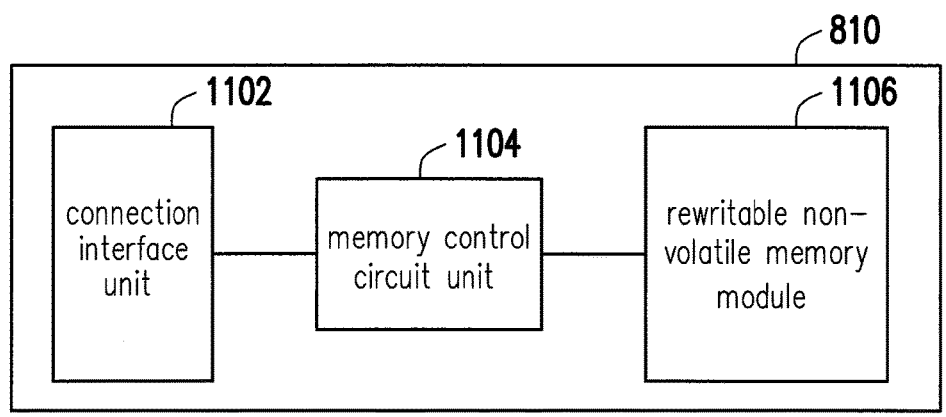
FIG. 11 is a schematic block diagram showing a memory storage device according to an exemplary embodiment of the disclosure.

FIG. 11 is a schematic block diagram showing the memory storage device according to an exemplary embodiment of the disclosure.

Referring to FIG. 11, the memory storage device 810 includes a connection interface unit 1102, a memory control circuit unit 1104, and a rewritable non-volatile memory module 1106.

The connection interface unit 1102 is configured to couple the memory storage device 810 to the host system 811. In this exemplary embodiment, the connection interface unit 1102 is compatible with the Serial Advanced Technology Attachment (SATA) standard. However, it should be noted that the disclosure is not limited thereto, and the connection interface unit 1102 may also comply with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the MCP interface standard, the Multi Media Card (MMC) interface standard, the Embedded Multimedia Card (eMMC) interface standard, the Universal Flash Storage (UFS) interface standard, the eMCP interface standard, the Compact Flash (CF) interface standard, the Integrated Device Electronics (IDE) interface standard, or other suitable standards. The connection interface unit 1102 may be packaged in a chip together with the memory control circuit unit 1104, or the connection interface unit 1002 may be disposed outside a chip including the memory control circuit unit 1104.

The memory control circuit unit 1104 is configured to execute a plurality of logic gates or control commands implemented in a hardware form or a firmware form, and perform various operations, such as data writing, data reading, and data erasing, in the rewritable non-volatile memory module 1106 according to a command of the host system 811.

The rewritable non-volatile memory module 1106 is coupled to the memory control circuit unit 1104 and is configured to store data written by the host system 811. The rewritable non-volatile memory module 1106 may be a Single Level Cell (SLC) NAND flash memory module (i.e., a flash memory module in which one memory cell stores 1 bit of data), a Multi Level Cell (MLC) NAND flash memory module (i.e., a flash memory module in which one memory cell stores 2 bits of data), a Triple Level Cell (TLC) NAND flash memory module (i.e., a flash memory module in which one memory cell stores 3 bits of data), other types of flash memory modules, or other memory modules having the same characteristics.

In an exemplary embodiment, the random data generation circuit 10 is disposed in the connection interface unit 1102 to provide the random data RD for encrypting and/or decrypting the data stored in the rewritable non-volatile memory module 1106. It should be noted that, in other exemplary embodiments not mentioned here, the random data generation circuit 10 may also be disposed in the memory control circuit unit 1104 or the rewritable non-volatile memory module 1106. The disclosure is not intended to limit where the random data generation circuit 10 is disposed. Furthermore, in another exemplary embodiment, the generated random data RD may be applied to other operations, such as an operation of generating a one-time verification code. The disclosure is not intended to limit use of the random data RD.

Figure 12:
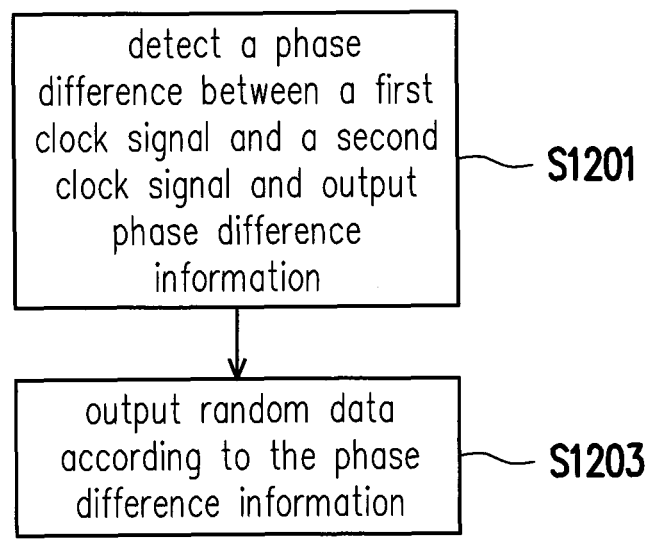
FIG. 12 is a flowchart showing a random data generation method according to an exemplary embodiment of the disclosure.

FIG. 12 is a flowchart showing a random data generation method according to an exemplary embodiment of the disclosure.

Referring to FIG. 12, in Step S1201, a phase difference between a first clock signal and a second clock signal is detected by a phase difference detection circuit of a memory storage device, and phase difference information is outputted. In this step, the phase difference detection circuit generates a plurality of sampling clock signals to sample the first clock signal and the second clock signal and generates a phase identification signal. Further, the phase difference detection circuit outputs phase difference information of the first clock signal and the second clock signal according to the phase identification signal.

In Step S1203, random data is outputted by a random data output circuit of the memory storage device according to the phase difference information. In this step, the random data output circuit determines the random data to be outputted according to a condition that the phase difference information meets. If the phase difference information meets a first condition, the random data output circuit outputs a first bit value as the random data. On the other hand, if the phase difference information meets a second condition, the random data output circuit outputs a second bit value as the random data. The first bit value is different from the second bit value. In an exemplary embodiment, if the phase difference information is odd, the phase difference information meets the first condition; and if the phase difference information is even, the phase difference information meets the second condition.

Details of each step of FIG. 12 have been specified above and thus are not repeated hereinafter. It should be noted that each step of FIG. 12 may be implemented as a plurality of program codes or circuits, and the disclosure is not intended to limit how each step is implemented. In addition, the method of FIG. 12 may be used in combination with the above-described exemplary embodiments or be used solely, and the disclosure is not limited to the above.

In conclusion of the above, the phase difference among multiple clock signals may change randomly due to a non-human factor, such as clock jitter. Therefore, the random data generation circuit of the disclosure samples multiple clock signals by using multiple sampling clock signals of different phases, so as to generate phase difference information with no regularity and thereby generate random data according to the phase difference information. Accordingly, the circuit configuration of the disclosure is capable of generating ideal and unpredictable random data.

The previously described exemplary embodiments of the present disclosure have the advantages aforementioned, wherein the advantages aforementioned not required in all versions of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A random data generation circuit, comprising:
 a phase difference detection circuit, configured to sample a first clock signal and a second clock signal based on a plurality of sampling clock signals, so as to detect a phase difference between the first clock signal and the second clock signal and output phase difference information; and
 a random data output circuit, coupled to the phase difference detection circuit and configured to output random data according to the phase difference information.

2. The random data generation circuit according to claim 1, wherein the phase difference detection circuit comprises:
 a sampling clock generation circuit, configured to generate the plurality of sampling clock signals according to an initial signal; and
 a sampling circuit, coupled to the sampling clock generation circuit and configured to sample the first clock signal and the second clock signal based on the sampling clock signals and generate a phase identification signal.

3. The random data generation circuit according to claim 2, wherein the sampling clock generation circuit comprises a plurality of buffer units connected in series,
 wherein the buffer units are configured to delay the initial signal and output the sampling clock signals.

4. The random data generation circuit according to claim 2, wherein the sampling circuit comprises:
 a first sampling module, coupled to the sampling clock generation circuit and configured to sample the first clock signal and the second clock signal based on a first sampling clock signal of the sampling clock signals; and
 a second sampling module, coupled to the sampling clock generation circuit and configured to sample the first clock signal and the second clock signal based on a second sampling clock signal of the sampling clock signals,
 wherein a predetermined phase difference exists between the first sampling clock signal and the second sampling clock signal.

5. The random data generation circuit according to claim 4, wherein the first sampling module comprises:
 a first sub-sampling circuit, configured to sample the first clock signal based on a first clock edge of the first sampling clock signal and output a first sampling result;
 a second sub-sampling circuit, configured to sample the second clock signal based on the first clock edge of the first sampling clock signal and output a second sampling result; and a logic circuit, coupled to the first sub-sampling circuit and the second sub-sampling circuit and configured to generate the phase identification signal according to the first sampling result and the second sampling result.

6. The random data generation circuit according to claim 2, wherein the phase difference detection circuit further comprises:
a phase difference identification circuit, coupled to the sampling circuit and configured to generate the phase difference information according to the phase identification signal.

7. The random data generation circuit according to claim 1, wherein the random data output circuit comprises a decision circuit coupled to the phase difference detection circuit,
wherein the decision circuit is configured to output a first bit value if the phase difference information meets a first condition,
wherein the decision circuit is further configured to output a second bit value if the phase difference information meets a second condition,
wherein the first bit value is different from the second bit value.

8. The random data generation circuit according to claim 1, wherein the phase difference comprises a first phase difference and a second phase difference, wherein the first phase difference is different from the second phase difference, wherein a difference value between the first phase difference and the second phase difference corresponds to a clock jitter of at least one of the first clock signal and the second clock signal.

9. The random data generation circuit according to claim 8, wherein an evaluation unit of the phase difference is consistent with a jitter unit of the clock jitter.

10. A memory storage device, comprising:
a connection interface unit coupled to a host system;
a rewritable non-volatile memory module; and
a memory control circuit unit, coupled to the connection interface unit and the rewritable non-volatile memory module,
wherein the connection interface unit comprises a random data generation circuit, which comprises:
a phase difference detection circuit, configured to sample a first clock signal and a second clock signal based on a plurality of sampling clock signals, so as to detect a phase difference between the first clock signal and the second clock signal and output phase difference information; and
a random data output circuit, coupled to the phase difference detection circuit and configured to output random data according to the phase difference information.

11. The memory storage device according to claim 10, wherein the phase difference detection circuit comprises:
a sampling clock generation circuit, configured to generate the plurality of sampling clock signals according to an initial signal; and
a sampling circuit, coupled to the sampling clock generation circuit and configured to sample the first clock signal and the second clock signal based on the sampling clock signals and generating a phase identification signal.

12. The memory storage device according to claim 11, wherein the sampling clock generation circuit comprises a plurality of buffer units connected in series,
wherein the buffer units are configured to delay the initial signal and output the sampling clock signals.

13. The memory storage device according to claim 11, wherein the sampling circuit comprises:
a first sampling module, coupled to the sampling clock generation circuit and configured to sample the first clock signal and the second clock signal based on a first sampling clock signal of the sampling clock signals; and
a second sampling module, coupled to the sampling clock generation circuit and configured to sample the first clock signal and the second clock signal based on a second sampling clock signal of the sampling clock signals,
wherein a predetermined phase difference exists between the first sampling clock signal and the second sampling clock signal.

14. The memory storage device according to claim 13, wherein the first sampling module comprises:
a first sub-sampling circuit, configured to sample the first clock signal based on a first clock edge of the first sampling clock signal and output a first sampling result;
a second sub-sampling circuit, configured to sample the second clock signal based on the first clock edge of the first sampling clock signal and output a second sampling result; and
a logic circuit, coupled to the first sub-sampling circuit and the second sub-sampling circuit and configured to generate the phase identification signal according to the first sampling result and the second sampling result.

15. The memory storage device according to claim 11, wherein the phase difference detection circuit further comprises:
a phase difference identification circuit, coupled to the sampling circuit and configured to generate the phase difference information according to the phase identification signal.

16. The memory storage device according to claim 10, wherein the random data output circuit further comprises:
a decision circuit, coupled to the phase difference detection circuit,
wherein the decision circuit is configured to output a first bit value if the phase difference information meets a first condition,
wherein the decision circuit is further configured to output a second bit value if the phase difference information meets a second condition,
wherein the first bit value is different from the second bit value.

17. The memory storage device according to claim 10, wherein the phase difference comprises a first phase difference and a second phase difference, wherein the first phase difference is different from the second phase difference, wherein a difference value between the first phase difference and the second phase difference corresponds to a clock jitter of at least one of the first clock signal and the second clock signal.

18. The memory storage device according to claim 17, wherein an evaluation unit of the phase difference is consistent with a jitter unit of the clock jitter.

19. A random data generation method adapted for a memory storage device, the random data generation method comprising:
sampling a first clock signal and a second clock signal based on a plurality of sampling clock signals, so as to detect a phase difference between the first clock signal and the second clock signal and outputting phase difference information; and outputting random data according to the phase difference information.

20. The random data generation method according to claim 19, wherein the step of detecting the phase difference of the first clock signal and the second clock signal comprises:
   generating the plurality of sampling clock signals according to an initial signal; and
   sampling the first clock signal and the second clock signal based on the sampling clock signals and generating a phase identification signal.

21. The random data generation method according to claim 20, wherein the step of generating the sampling clock signals according to the initial signal comprises:
   delaying the initial signal to output the sampling clock signals.

22. The random data generation method according to claim 20, wherein the step of sampling the first clock signal and the second clock signal based on the sampling clock signals and generating the phase identification signal comprises:
   sampling the first clock signal and the second clock signal based on a first sampling clock signal of the sampling clock signals; and
   sampling the first clock signal and the second clock signal based on a second sampling clock signal of the sampling clock signals,
   wherein a predetermined phase difference exists between the first sampling clock signal and the second sampling clock signal.

23. The random data generation method according to claim 22, wherein the step of sampling the first clock signal and the second clock signal based on the first sampling clock signal of the sampling clock signals comprises:
   sampling the first clock signal based on a first clock edge of the first sampling clock signal and outputting a first sampling result;
   sampling the second clock signal based on the first clock edge of the first sampling clock signal and outputting a second sampling result; and
   generating the phase identification signal according to the first sampling result and the second sampling result.

24. The random data generation method according to claim 20, further comprising:
   generating the phase difference information according to the phase identification signal.

25. The random data generation method according to claim 19, wherein the step of outputting the random data according to the phase difference information comprises:
   outputting a first bit value if the phase difference information meets a first condition; and
   outputting a second bit value if the phase difference information meets a second condition,
   wherein the first bit value is different from the second bit value.

26. The random data generation method according to claim 19, wherein the phase difference comprises a first phase difference and a second phase difference, wherein the first phase difference is different from the second phase difference, wherein a difference value between the first phase difference and the second phase difference corresponds to a clock jitter of at least one of the first clock signal and the second clock signal.

27. The random data generation method according to claim 26, wherein an evaluation unit of the phase difference is consistent with a jitter unit of the clock jitter.

* * * * *